United States Patent
Boday et al.

(10) Patent No.: US 9,433,082 B1
(45) Date of Patent: Aug. 30, 2016

(54) PROPAGATION VELOCITY TUNING WITH FUNCTIONALIZED CARBON NANOMATERIAL IN PRINTED WIRING BOARDS (PWBS) AND OTHER SUBSTRATES, AND DESIGN STRUCTURES FOR SAME

(71) Applicant: International Business Machines Corporation, Armonk, NY (US)

(72) Inventors: Dylan J. Boday, Tucson, AZ (US); Samuel R. Connor, Apex, NC (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/730,286

(22) Filed: Jun. 4, 2015

Related U.S. Application Data

(63) Continuation of application No. 14/674,011, filed on Mar. 31, 2015.

(51) Int. Cl.
  *H05K 1/00* (2006.01)
  *H05K 1/02* (2006.01)

(52) U.S. Cl.
  CPC .......... *H05K 1/0248* (2013.01); *H05K 1/0216* (2013.01); *H05K 1/0245* (2013.01)

(58) Field of Classification Search
  CPC ............ H05K 1/00; H05K 1/02; H05K 1/03; H05K 1/11; H05K 1/14; H05K 3/00; H05K 3/36; H01L 21/4763; B29C 59/00; C01B 3/00; C01B 31/00; C01B 31/02; C08K 7/00; C08K 7/24

USPC ......... 174/255, 258–262, 265, 266; 361/118, 361/752, 784; 342/1, 4, 22, 637, 639; 423/447.1, 447.2; 427/313, 249.1; 428/195.1

See application file for complete search history.

(56) References Cited

U.S. PATENT DOCUMENTS

| | | |
|---|---|---|
| 6,349,402 B1 | 2/2002 | Lin |
| 7,843,026 B2 | 11/2010 | Wang et al. |

(Continued)

FOREIGN PATENT DOCUMENTS

| | | |
|---|---|---|
| JP | 2001267782 A | 3/2000 |
| WO | WO2011139137 A1 | 11/2011 |

OTHER PUBLICATIONS

Brooks, "Adjusting Signal Timing (Part 1)," UltraCAD Design, Inc., 2003, pp. 1-9, downloaded from <http://www.ultracad.com/mentor/mentor%20signal%20timing1.pdf> on Feb. 27, 2015.

(Continued)

*Primary Examiner* — Xiaoliang Chen
(74) *Attorney, Agent, or Firm* — Matthew J. Bussan

(57) ABSTRACT

An apparatus has a permittivity attenuation layer interposed between a substrate and a first conductive trace, wherein the permittivity attenuation layer comprises a resin matrix containing functionalized carbon nanomaterial, such as functionalized single-wall carbon nanotubes (f-SWNTs). In some embodiments, a design structure for designing, manufacturing, or testing the apparatus is tangibly embodied in a machine readable medium. In some embodiments, the apparatus comprises an enhanced laminate core for use in a printed wiring board (PWB) that contains a differential pair having an inner-leg conductive trace and an outer-leg conductive trace. A permittivity attenuation layer is interposed between the inner-leg conductive trace and a laminate core, wherein the loading level of f-SWNTs in the permittivity attenuation layer is selected to attenuate the permittivity of the inner-leg conductive trace to match the permittivity of the outer-leg conductive trace.

2 Claims, 4 Drawing Sheets

(56) References Cited

U.S. PATENT DOCUMENTS

| | | | |
|---|---|---|---|
| 8,248,305 | B2 | 8/2012 | Curran et al. |
| 2004/0186220 | A1 | 9/2004 | Smalley et al. |
| 2010/0009165 | A1 | 1/2010 | Patel et al. |
| 2010/0143718 | A1 | 6/2010 | Smalley et al. |
| 2011/0303445 | A1* | 12/2011 | Cases .............. H05K 1/024 174/258 |
| 2013/0130049 | A1 | 5/2013 | Moilanen et al. |
| 2013/0224023 | A1 | 8/2013 | Kim et al. |
| 2014/0132439 | A1 | 5/2014 | Hirose |
| 2015/0367557 | A1* | 12/2015 | Wei .............. B29C 59/005 428/195.1 |

OTHER PUBLICATIONS

Higginbotham et al., "Tunable Permittivity of Polymer Composites through Incremental Blending of Raw and Functionalized Single-Wall Carbon Nanotubes," J. Phys. Chem., 2007, vol. 111, No. 48, pp. 17751-17754.

Grimes et al., "Effect of purification of the electrical conductivity and complex permittivity of multiwall carbon nanotubes," J. Appl. Phys., 2001, vol. 90, No. 8, pp. 4134-4137.

Dyke et al., "Solvent-Free Functionalization of Carbon Nanotubes," J. Am. Chem. Soc., 2003, vol. 125, No. 5, pp. 1156-1157.

U.S. Appl. No. 14/674,011, to Dylan J. Boday et al., entitled "Propagation Velocity Tuning With Functionalized Carbon Nanomaterial in Printed Wiring Boards (PWBs) and Other Substrates, and Design Structures for Same", filed Mar. 31, 2015, assigned to International Business Machines Corporation.

List of IBM Patents or Patent Applications Treated as Related.

U.S. Appl. No. 15/206,258, to Dylan J. Boday et al., entitled "Propagation Velocity Tuning With Functionalized Carbon Nanomaterial in Printed Wiring Boards (PWBs) and Other Substrates, and Design Structures for Same", filed Jul. 9, 2016, assigned to International Business Machines Corporation.

List of IBM Patents or Patent Applications Treated as Related (updated Jul. 10, 2016).

* cited by examiner

US 9,433,082 B1

PROPAGATION VELOCITY TUNING WITH FUNCTIONALIZED CARBON NANOMATERIAL IN PRINTED WIRING BOARDS (PWBS) AND OTHER SUBSTRATES, AND DESIGN STRUCTURES FOR SAME

CROSS-REFERENCE TO RELATED APPLICATION

This patent application is a continuation application of pending U.S. patent application Ser. No. 14/674,011, filed Mar. 31, 2015, entitled "PROPAGATION VELOCITY TUNING WITH FUNCTIONALIZED CARBON NANO-MATERIAL IN PRINTED WIRING BOARDS (PWBs) AND OTHER SUBSTRATES, AND DESIGN STRUCTURES FOR SAME", which is hereby incorporated herein by reference in its entirety.

BACKGROUND

The present invention relates in general to printed wiring boards (PWBs) and other substrates, and to design structures for same. More particularly, the present invention relates to tuning the propagation velocity of a signal through a conductive trace of a PWB or other substrate by interposing a permittivity attenuation layer containing functionalized carbon nanomaterial, such as functionalized single-wall carbon nanotubes (f-SWNTs), between the conductive trace and the substrate, and to a design structure for same.

SUMMARY

According to some embodiments of the present invention, an apparatus has a permittivity attenuation layer interposed between a substrate and a first conductive trace, wherein the permittivity attenuation layer comprises a resin matrix containing functionalized carbon nanomaterial, such as functionalized single-wall carbon nanotubes (f-SWNTs). In some embodiments of the present invention, a design structure for designing, manufacturing, or testing the apparatus is tangibly embodied in a machine readable medium. In some embodiments of the present invention, the apparatus comprises an enhanced laminate core for use in a printed wiring board (PWB) that contains a differential pair having an inner-leg conductive trace and an outer-leg conductive trace. A permittivity attenuation layer is interposed between the inner-leg conductive trace and a laminate core, wherein the loading level of f-SWNTs in the permittivity attenuation layer is selected to attenuate the permittivity of the inner-leg conductive trace to match the permittivity of the outer-leg conductive trace. Hence, in accordance with some embodiments of the present invention, it is possible to eliminate, or at least substantially reduce, in-pair skew.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

Figure 1:
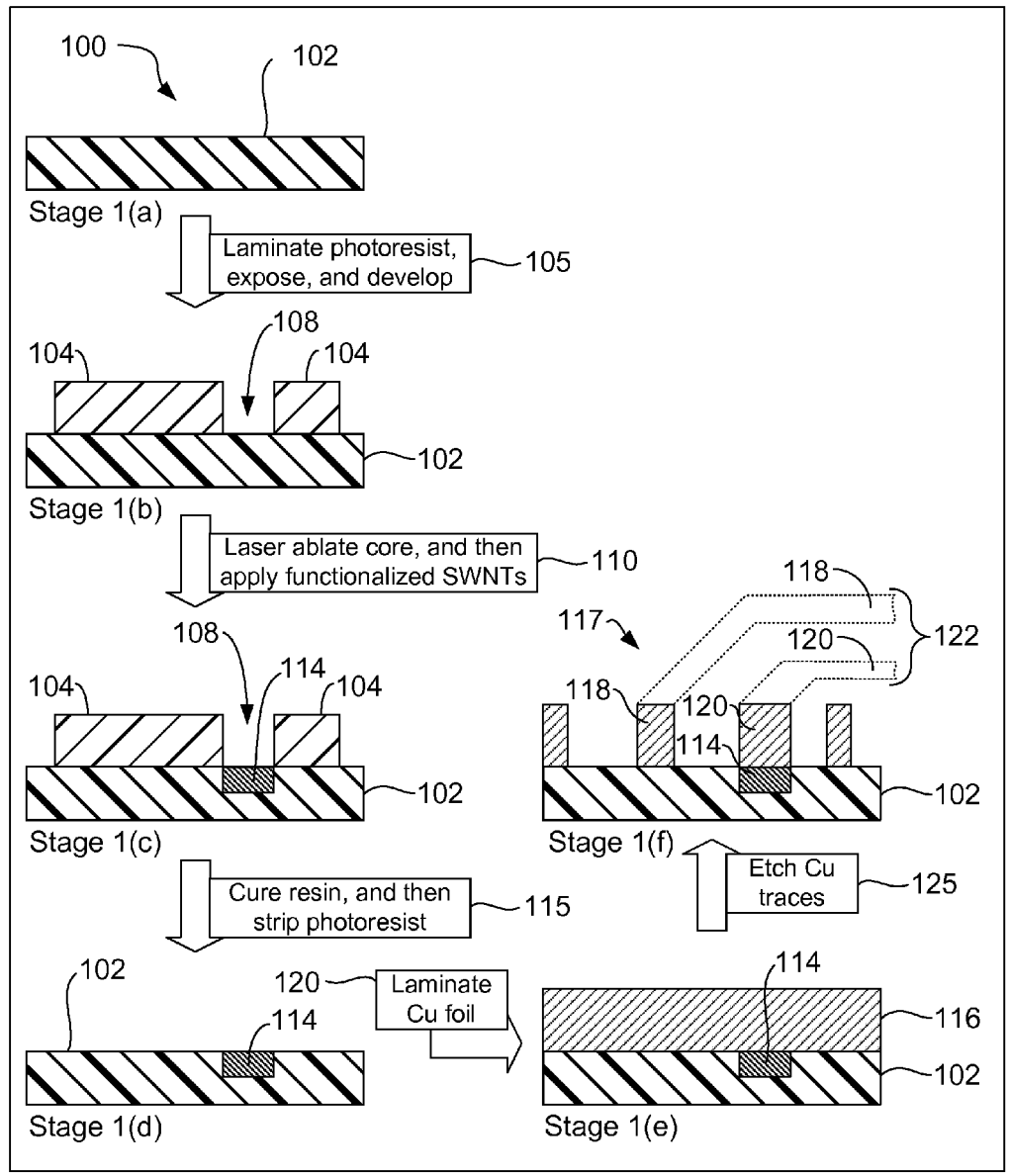
FIG. 1 is a flow diagram illustrating, through a sequence of stages 1(a)-1(f), a method of fabricating an enhanced laminate core having a permittivity attenuation layer containing functionalized carbon nanomaterial, such as functionalized single-wall carbon nanotubes (f-SWNTs), interposed between a laminate core and an inner-leg conductive trace of a differential pair in accordance with some embodiments of the present invention.

When a signal is propagated on a differential pair of conducive traces routed on a printed wiring board (PWB) at the board level (or on a chip at a chip level), each trace propagates a mirror image wave form. That is, a differential pair is two complementary conductive traces that transfer equal and opposite signals down their length. Differential pairs are also referred to as "differential trace pairs."

A length mismatch is created when a differential pair is routed through a turn (i.e. the outer leg of the differential pair is longer than the inner leg of the differential pair), resulting in degraded signal integrity and increased radiated electromagnetic interference (EMI). For purposes of this document, including the claims, the terminology "outer-leg conductive trace" refers to the conductive trace of a differential pair that lies on the outside of a turn made by the differential pair (i.e., this is the "longer" conductive trace through the turn), and the terminology "inner-leg conductive trace" refers to the conductive trace of that same differential pair that lies on the inside of the turn made by the differential pair (i.e., this is the "shorter" conductive trace through the turn).

Typically, electrical designers try to mitigate the impact of turns in the routing of differential pairs by compensating left hand turns with an equal number of right hand turns, or via incorporation of one or more "trombones" on the shorter leg (i.e., the inner-leg conductive trace). A trombone, which is a deviation from the most direct path, adds length to a conductive trace. A conductive trace that incorporates a trombone deviates into surrounding available space and then loops back upon itself. The practice of using such loopbacks is referred to as "tromboning". Additional details regarding trombones are disclosed in U.S. Pat. No. 6,349,402 B1.

Each of these conventional techniques for mitigating the impact of turns in the routing of differential pairs (i.e., compensating left hand turns with an equal number on right hand turns and "tromboning") can result in a more complex layout and/or an impedance discontinuity. These and other deleterious effects introduced by trombones, in general and in the context of differential pairs, are disclosed in Brooks, "Adjusting Signal Timing (Part 1)," UltraCAD Design, Inc., 2003, pp 1-9. Consequently, a need exists for a mechanism to eliminate, or at least substantially reduce, in-pair skew that does not depend on either of the above-discussed conventional mitigation techniques (i.e., compensating left hand turns with an equal number on right hand turns and "tromboning").

In accordance with some embodiments of the present invention, an apparatus has a permittivity attenuation layer interposed between a substrate and a first conductive trace, wherein the permittivity attenuation layer comprises a resin matrix containing functionalized carbon nanomaterial, such as functionalized single-wall carbon nanotubes (f-SWNTs). For example, the apparatus may be in the form of a printed wiring board (PWB), a chip, or other substrate, such as a laminate subcomposite, an interconnect substrate (e.g., an interposer or a module substrate), or a flex cable. Printed wiring boards (PWBs) are also referred to as printed circuit board (PCBs).

In some embodiments of the present invention, a design structure for designing, manufacturing, or testing such an apparatus is tangibly embodied in a machine readable medium. These embodiments encompass the apparatus as it resides in design files or design structures (e.g., GDSII, GL1, or OASIS data files).

In some embodiments of the present invention, the apparatus comprises an enhanced laminate core for use in a printed wiring board (PWB) that contains a differential pair having an inner-leg conductive trace and an outer-leg conductive trace. A permittivity attenuation layer is interposed between the inner-leg conductive trace and a laminate core, wherein the loading level of f-SWNTs in the permittivity attenuation layer is selected to attenuate the permittivity of the inner-leg conductive trace to match the permittivity of the outer-leg conductive trace. Hence, in accordance with some embodiments of the present invention, it is possible to eliminate, or at least substantially reduce, in-pair skew without depending on either of the above-discussed conventional mitigation techniques (i.e., compensating left hand turns with an equal number on right hand turns and "tromboning").

Dielectric constant (Dk) is an important parameter related to dielectric loss in PWBs. Dk is also referred to as relative permittivity. In a PWB laminate, the Dk is the ratio of the capacitance between a pair of conductors separated by a dielectric material (e.g., epoxy-based resin) compared to the capacitance between that pair of conductors in a vacuum. The Dk of a PWB laminate will vary depending on the PWB substrate material used to make it, as well as signal frequency. PWB substrate materials with lower Dk values contribute to a lower dielectric loss. Moreover, in PWB laminates made from PWB substrate materials with higher Dk values, signals will propagate more slowly through the conductors. In fact, the propagation delay time is a function of the square root of the Dk value of the PWB substrate material.

As signal speeds increase (i.e., as signal frequency increases), the need for PCB substrate materials having low Dk (e.g., at 1-3 GHz, Dk<4.0, preferably Dk<3.7, more preferably Dk<3.5) becomes critical. As a point of reference, the Dk of FR4 is approximately 4.3 at 1 GHz. FR4, which is a composite material composed of woven glass fabric impregnated with an epoxy resin varnish, is used in many PCBs.

Within this general environment of PCB substrate materials having low Dk, in accordance with some embodiments of the present invention, localized regions of higher Dk (i.e., the Dk of these localized regions is "higher" relative to the Dk of the surrounding PCB substrate materials) are introduced to produce a predetermined amount of signal propagation delay in portions of conductive traces routed through these regions. These localized regions of higher Dk serve to attenuate the permittivity of the portions of the conductive traces routed through these regions. Accordingly, these localized regions of higher Dk are referred to herein as "permittivity attenuation layers." The present invention takes advantage of a signal propagation delay effect introduced by a permittivity attenuation layer interposed between a conductive trace and a substrate material, wherein the permittivity attenuation layer comprises a resin matrix containing functionalized carbon nanomaterial, such as functionalized single-wall carbon nanotubes (f-SWNTs). Optionally, the permittivity attenuation layer may contain non-functionalized (i.e., raw) carbon nanomaterial, such as non-functionalized single-wall carbon nanotubes (SWNTs), in the resin matrix in addition to the functionalized carbon nanomaterial.

Generally, the permittivity of polymer composite materials can be adjusted by the addition of carbon nanomaterial. Increasing the loading level of carbon nanomaterial in polymer composite materials typically increases the permittivity. For example, the real permittivity (Er) of SWNT polymer composites, at 500 MHz-5.5 GHz, can be adjusted (increased) by a factor of approximately 35× by varying the loading level of non-functionalized SWNTs from 0 wt % to 23 wt %.

Typically, increasing the loading level of non-functionalized carbon nanomaterial in a polymer composite material increases the permittivity at a much faster rate than increasing the loading level of functionalized carbon nanomaterial in that same polymer composite material. Functionalization of SWNTs, for example, disrupts the conducting network in the carbon nanotube and thereby dramatically changes permittivity and other electronic properties. Even a low degree of functionalization (e.g., a SWNT is functionalized to contain a single functional group per every 100 carbons) removes the metallic-like van Hove transitions in SWNTs. Hence, at a given loading level, the permittivity of a polymer composite material containing functionalized carbon nanomaterial will be considerably lower than that same polymer composite material containing non-functionalized carbon nanomaterial. Higginbotham et al., "Tunable Permittivity of Polymer Composites through Incremental Blending of Raw and Functionalized Single-Wall Carbon Nanotubes", J. Phys. Chem. C, 2007, Vol. 111, pp 17751-17754, which is hereby incorporated herein by reference in its entirety, discloses that by simply blending the two types of single-wall carbon nanotubes (f-SWNTs and raw SWNTs) together into the same silicone elastomer matrix at varying ratios, while keeping the total weight percent of SWNTs included in the resulting composite constant at 0.5 wt %, the real permittivity (Er) of the resulting composite can be tuned to any desired value between 20 and 3.

As noted above, the present invention takes advantage of a signal propagation delay effect introduced by a permittivity attenuation layer interposed between a conductive trace and a substrate material, wherein the permittivity attenuation layer comprises a resin matrix containing functionalized carbon nanomaterial, such as f-SWNTs. Optionally, the permittivity attenuation layer may contain non-functionalized (i.e., raw) carbon nanomaterial, such as non-functionalized SWNTs, in addition to the functionalized carbon nanomaterial. Permittivity can be varied depending on the degree of functionalization and/or loading level(s) of functionalized carbon nanomaterial and non-functionalized carbon nanomaterial (if any) in the resin matrix of the permittivity attenuation layer.

The permittivity attenuation layer may be, for example, interposed between an inner-leg conductive trace of a differential pair and a substrate to slow down signal propagation through the inner-leg conductive trace. Preferably, the permittivity attenuation layer is interposed between the inner-leg conductive trace of a differential pair and the substrate only in a length-mismatch region defined by the turn through which the differential pair traverses (i.e., this length-mismatch region extends from a location near where the length mismatch between the outer- and inner-leg conductive traces begins to a location near where the length mismatch ends). The turn through which a differential pair traverses is often expressed in terms of an angle (e.g., 45°, 90°, and the like).

Hence, in accordance with some embodiments of the present invention, it is possible to vary the permittivity of the composite laminate material to account for the angle through which such a differential pair traverses. It is possible, therefore, to vary the permittivity of the composite laminate material to eliminate, or at least substantially reduce, in-pair skew. Moreover, in accordance with some embodiments of the present invention, the functionality of the carbon nanomaterial in the resin matrix can be matched to the composite laminate material and, hence, the functionalized carbon nanomaterial becomes part of (covalently bonds to) the matrix.

The carbon nanomaterial that can be used (in non-functionalized and/or functionalized form) in accordance with some embodiments of the present invention may be either hollow (e.g., carbon nanotubes (CNTs)) or solid (e.g., carbon nanofibers (CNFs)). Carbon nanotubes include single-wall carbon nanotubes (SWNTs) and multi-wall carbon nanotubes (MWNTs).

Commercially available SWNTs that can be used (in non-functionalized and/or functionalized form) in accordance with some embodiments of the present invention include, but are not limited to, HiPco SWNTs available from Unidym Inc., Sunnyvale, Calif., USA.

Commercially available MWNTs that can be used (in non-functionalized and/or functionalized form) in accordance with some embodiments of the present invention include, but are not limited to, VGCF and VGCF-H both available from Showa Denko K.K., Tokyo, Japan and Flo-Tube 9000 available from CNano Technology, Limited, San Francisco, Calif., USA.

Commercially available CNFs that can be used (in non-functionalized and/or functionalized form) in accordance with some embodiments of the present invention include, but are not limited to, Pyrograf-III (PR-19-XT-LHT) available from Pyrograf Products, Inc., Cedarville, Ohio, USA.

The loading level of the functionalized carbon nanomaterial (and, optionally, the loading level of the non-functionalized carbon nanomaterial) in the resin matrix of a permittivity attenuation layer, in accordance with some embodiments of the present invention, may be empirically determined based on the amount of permittivity attenuation/signal propagation delay that is desired. Typically, the total loading level of both the functionalized and non-functionalized carbon nanomaterial will be within the range from 0.1 wt % to 25 wt %. The loading level of the functionalized carbon nanomaterial may represent any portion or the entirety of the total loading level.

In accordance with some embodiments of the present invention, a wiring diagram (e.g., showing the routing of the individual conductive traces of differential pairs of a PWB, a laminate subcomposite, or other substrates) may be used to determine where the functionalized SWNTs (and/or other functionalized carbon nanomaterial and, optionally, non-functionalized carbon nanomaterial) need to be incorporated. The functionalized SWNTs (and/or other functionalized carbon nanomaterial and, optionally, non-functionalized carbon nanomaterial) may be incorporated where needed (e.g., underlying an inner-leg conductive trace of a differential pair in a length-mismatch region defined by the turn through which the differential pair traverses) via conventional lithography techniques. FIG. 1 illustrates one such embodiment.

FIG. 1 is a flow diagram illustrating, through a sequence of stages 1(a)-1(f), a method 100 of fabricating an enhanced laminate core having a permittivity attenuation layer containing functionalized carbon nanomaterial, such as functionalized single-wall carbon nanotubes (f-SWNTs), interposed between a laminate core and an inner-leg conductive trace of a differential pair in accordance with some embodiments of the present invention. In FIG. 1, each of the stages 1(a)-1(f) is a partial, sectional view of the same section at successive stages of fabrication of the enhanced laminate core, which is to be further processed to produce a PWB.

In the method 100, the steps discussed below (steps 105, 110, 115, 120 and 125) are performed. These steps are set forth in their preferred order. It must be understood, however, that the various steps may occur simultaneously or at other times relative to one another. Moreover, those skilled in the art will appreciate that one or more steps may be omitted.

Stage 1(a) of FIG. 1 shows a partial, sectional view of a laminate core 102. The laminate core 102 may be, for example, constructed of a glass cloth or other glass fiber substrate impregnated with a varnish coating. The glass cloth is typically constructed of bundles of glass fibers woven together in an orthogonal fashion, with the bundles typically being perpendicular to each other. The varnish coating may be any suitable resin, including but not limited to, an epoxy-based resin, a bismaleimide triazine (BT) resin, a polyphenylene oxide (PPO)/triallylisocyanurate (TAIC) composition, and combinations thereof. Suitable epoxy-based resins include, but are not limited to, bisphenol-A type epoxy resins, polyglycol di-epoxide liquid resins, and the like. Bisphenol A type epoxy resins, which are produced from bisphenol A and epichloroydrin, are commercially available. Depending on the application, flexible resins such as polyglycol di-epoxide liquid resins may be preferred to impart flexibility. Polyglycol di-epoxide liquid resins, which are produced from polypropylene glycol and epichlorohydrin, are commercially available.

The method 100 begins by laminating a photoresist (104 shown in stage 1(b), described below) to the laminate core 102, followed by conventional expose and develop processes to open up various regions (e.g., region 108 shown in stage 1(b), described below) on the laminate core 102, including those regions on the laminate core 102 that will require permittivity modification (step 105).

Stage 1(b) of FIG. 1 shows a partial, sectional view of the laminate core 102 having a photoresist 104 laminated thereon and having a region 108 opened up in the photoresist 104 by conventional expose and develop processes. The open region 108 corresponds to a region where an inner-leg conductive trace (120 shown in stage 1(f), described below) of a differential pair (122 shown in stage 1(f), described below) will be formed and where permittivity modification is required via formation of a permittivity attenuation layer (114 shown in stage 1(c), described below). Hence, the open region 108 is also referred to herein as the "permittivity attenuation layer formation region."

The open region 108 requires permittivity modification, but an adjacent region where an outer-leg conductive trace (118 shown in stage 1(f), described below) of the differential pair 122 will be formed does not require permittivity modification. Accordingly, the permittivity attenuation layer 114 containing functionalized carbon nanomaterial, such as f-SWNTs, (and, optionally, non-functionalized carbon nanomaterial, such as non-functionalized SWNTs) is applied to the open region 108. Henceforth in the description of method 100, f-SWNTs and non-functionalized SWNTs will be used as exemplary functionalized and non-functionalized carbon nanomaterials. One skilled in the art will appreciate, however, that any suitable functionalized and non-functionalized carbon nanomaterials may be used in lieu of, or in addition to, f-SWNTs and non-functionalized SWNTs Preferably, the permittivity attenuation layer 114 is interposed between the inner-leg conductive trace of the differential pair and the substrate only in a length-mismatch region defined by the turn through which the differential pair traverses, i.e., this length-mismatch region extends from a location near where the length mismatch between the outer- and inner-leg conductive traces begins to a location near where the length mismatch ends. It is possible, therefore, for a conductive trace that is routed through multiple turns (i.e., turns where the conductive trace is the inner-leg of the differential pair) to have its permittivity attenuated at each such turn by a separate permittivity attenuation layer. Moreover, it is possible for both of the conductive traces of a differential pair to have their permittivity attenuated in a case where the differential pair is routed through multiple turns (e.g., one of the conductive traces is the inner-leg in a first turn and the other of the conductive traces is the inner-leg in a second turn).

In the embodiment shown in FIG. 1, the method 100 continues by laser ablating the laminate core 102 and applying the permittivity attenuation layer 114 containing f-SWNTs and, optionally, non-functionalized SWNTs to the laser ablated surface of the laminate core 102 exposed in the open region 108 (step 110).

In the step 110, the laminate core 102 is laser ablated in the region 108 to a suitable depth. One skilled in the art will appreciate that the depth of laser ablation will vary depending on the application. Typically, it is desirable to laser ablate as deeply as possible into the substrate without adversely impacting the substrate.

Also in step 110, f-SWNTs and, optionally, non-functionalized SWNTs may be blended into a suitable resin carrier (e.g., uncured epoxy-based resin) in an amount sufficient to achieve a suitable loading level, and then deposited on the open region 108 to form a resin coating (i.e., the permittivity attenuation layer 114, in an at least partially uncured state) via any number of conventional techniques well known in the art. Suitable techniques for applying the resin carrier having the f-SWNTs and the non-functionalized SWNTs (if any) blended therein include, but are not limited to, screen coating, spray-coating, and dip/immersion coating. Preferably, the resin carrier, when cured, bonds to the varnish coating of the laminate core 102.

Suitable resin carriers include, but are not limited to, an epoxy-based resin, a bismaleimide triazine (BT) resin, a polyphenylene oxide (PPO)/triallylisocyanurate (TAIC) composition, and combinations thereof.

The loading level of the f-SWNTs and the non-functionalized SWNTs (if any) in the resin carrier may be empirically determined based on the amount of permittivity attenuation/signal propagation delay that is desired.

The resin carrier having the f-SWNTs and the non-functionalized SWNTs (if any) blended therein is applied to form a resin coating permittivity attenuation layer 114 having a suitable thickness. One skilled in the art will appreciate that the thickness of the permittivity attenuation layer 114 will vary depending on the application. Typically, it is desirable to form the permittivity attenuation layer 114 flush with the surface of the substrate, in which case the thickness of the permittivity attenuation layer 114 is defined by the depth of laser ablation. Preferably, the width of the permittivity attenuation layer 114 (which is defined by the region 108 opened up in the photoresist 104) is selected to correspond to that of the inner-leg conductive trace 120.

Stage 1(c) of FIG. 1 shows a partial, sectional view of the laminate core 102 having the permittivity attenuation layer 114 applied thereto in the region 108 opened up in the photoresist 104.

The method 100 continues by curing the resin coating (i.e., the permittivity attenuation layer 114, in an at least partially uncured state), and then stripping the photoresist 104 (step 115). The curing and stripping may be accomplished using any of numerous conventional techniques well known in the art. In the step 115, curing the resin in the permittivity attenuation layer 114 serves both to bond the permittivity attenuation layer 114 to the laminate core 102 and to bond the functionalized SWNTs and non-functionalized SWNTs (if any) to the core material.

Stage 1(d) of FIG. 1 shows a partial, sectional view of the laminate core 102 and the permittivity attenuation layer 114, after the photoresist has been stripped away.

The method 100 continues by laminating copper foil (116 in stage 1(e), described below) onto the laminate core 102 and the permittivity attenuation layer 114 (step 120). The copper lamination may be accomplished using any of numerous conventional copper foil laminating techniques well known in the art.

Stage 1(e) of FIG. 1 shows a partial, sectional view of the laminate core 102 and the permittivity attenuation layer 114, after the copper foil 116 has been laminated thereto.

The method 100 continues by etching the copper foil (step 125). This forms the copper traces, i.e., the outer-leg conductive trace 118 on the laminate core 102 and the inner-leg conductive trace 120 on the permittivity attenuation layer 114. The copper etching may be accomplished using any of numerous conventional copper etching techniques well known in the art.

Stage 1(f) of FIG. 1 shows a partial, sectional view of an enhanced laminate core 117 that comprises the laminate core 102, the outer-leg conductive trace 118 formed atop the laminate core 102, and the inner-leg conductive trace 120 formed in physical and electrical contact with the permittivity attenuation layer 114. A portion of the routing of the outer-leg conductive trace 118 and a portion of the routing of the inner-leg conductive trace 120 are shown in dotted lines in stage 1(f). The outer-leg conductive trace 118 and the inner-leg conductive trace 120 together define a portion of the differential pair 122.

Because the inner-leg conductive trace 120 is formed on and in electrical contact with the permittivity attenuation layer 114, which contains f-SWNTs and, optionally, non-functionalized SWNTs, the permittivity of the inner-leg conductive trace 120 can be attenuated to match that of the outer-leg conductive trace 118. This permittivity tailoring can be easily accomplished by, for example, altering the loading level of the f-SWNTs and the loading level of the non-functionalized SWNTs (if any) in the resin carrier used to produce the permittivity attenuation layer 114. In this fashion, permittivity can be tailored to the trace geometry to ensure that in-pair skew is eliminated, or at least substantially reduced.

The loading level of the f-SWNTs and the loading level of the non-functionalized SWNTs (if any) in the resin carrier used to produce the permittivity attenuation layer may be empirically determined based on the amount of permittivity attenuation/signal propagation delay that is desired.

Subsequent to the step 125, the enhanced laminate core 117 may be subjected to conventional inner core processing steps well known in the art to complete the fabrication of the PWB. For example, a plurality of cores, one or more of which correspond to the enhanced laminate core 117, may be laminated together using partially cured varnish/glass layers (typically in the form of one or more "prepregs") with temperature and pressure, causing the varnish coating to flow between the layers to form a robust composite laminate structure. A sheet of what is referred to as "prepreg" is a glass cloth impregnated with a resin solution which is either dried or at least partially cured.

Figure 2:
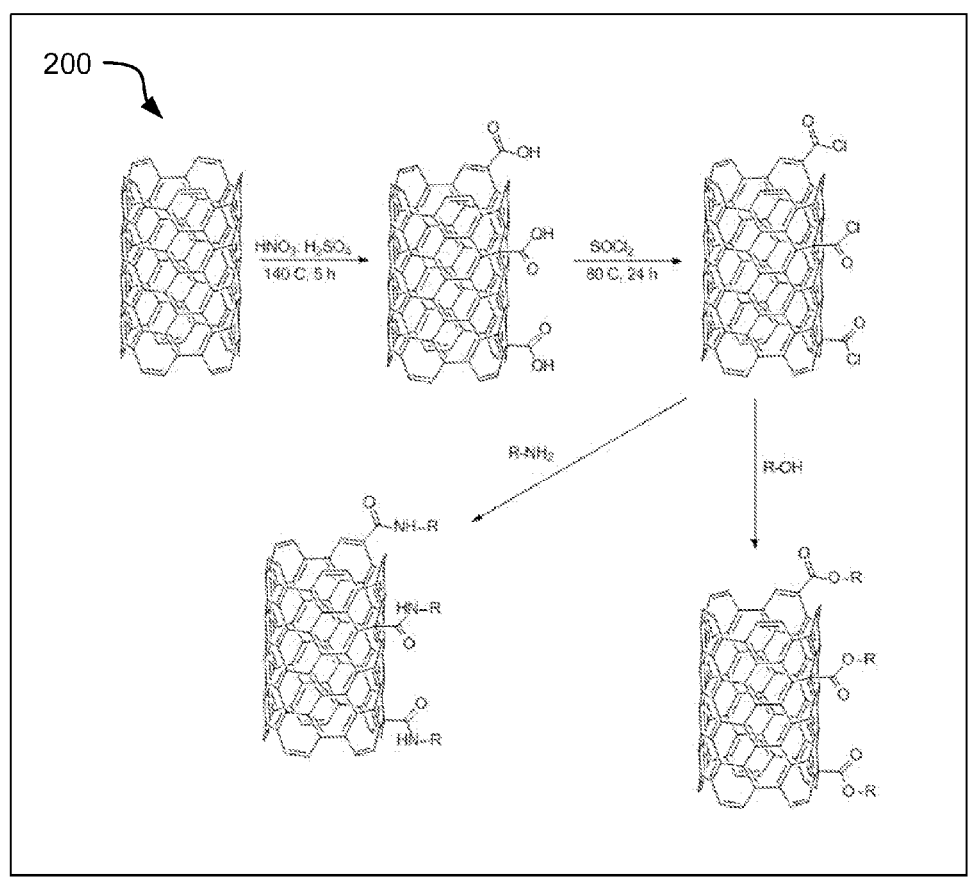
FIG. 2 is a chemical reaction diagram showing an exemplary synthesis of functionalized single-wall carbon nanotubes (f-SWNTs) in accordance with some embodiments of the present invention.

FIG. 2 is a chemical reaction diagram showing an exemplary synthesis of functionalized single-wall carbon nanotubes (f-SWNTs) in accordance with some embodiments of the present invention. SWNTs can be easily functionalized using the exemplary synthesis shown in FIG. 2, the exemplary synthesis shown in FIG. 3, or any of a myriad of other synthetic procedures known to those skilled in the art. The reaction scheme shown in FIG. 2 has three steps.

In the first step of the reaction scheme shown in FIG. 2, SWNTs are functionalized to include carboxylic functional groups by reacting them in a mixture of nitric acid ($HNO_3$) and sulfuric acid ($H_2SO_4$) (1:3-3:1) at 140° C. for approximately 5 hours.

In the second step of the reaction scheme shown in FIG. 2, the functionalized SWNTs prepared in the first step are further functionalized to include chloro functional groups by reacting them with thionyl chloride ($SOCl_2$) at 80° C. for approximately 24 hours.

In the third step of the reaction scheme shown in FIG. 2, the functionalized SWNTs prepared in the second step are further functionalized to include either amine functional groups or alkoxy functional groups by reaction with a final reagent (e.g., either an amine (R—$NH_2$) or an alcohol (R—OH)). R may be any suitable organofunctional group. R is preferably a matrix-reactive group that includes at least one moiety (e.g., a vinyl-, allyl-, amine-, amide-, or epoxy-containing moiety) capable of reacting with and bind to the resin matrix. By judicious selection of the final reagent, the SWNTs can be functionalized to bind to the resin matrix.

Figure 3:
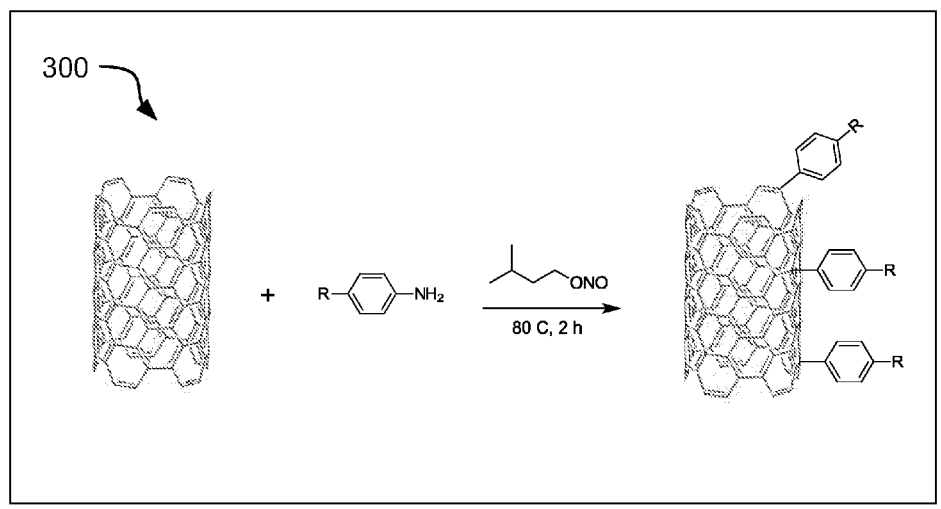
FIG. 3 is a chemical reaction diagram showing another exemplary synthesis of functionalized single-wall carbon nanotubes (f-SWNTs) in accordance with some embodiments of the present invention.

FIG. 3 is a chemical reaction diagram showing another exemplary synthesis of functionalized single-wall carbon nanotubes (f-SWNTs) in accordance with some embodiments of the present invention. As noted above, SWNTs can be easily functionalized using the exemplary synthesis shown in FIG. 2, the exemplary synthesis shown in FIG. 3, or any of a myriad of other synthetic procedures known to those skilled in the art. The reaction scheme shown in FIG. 3 advantageously prepares the f-SWNTs under solvent-free conditions using a single step.

In the reaction scheme shown in FIG. 3, SWNTs are functionalized using 4-tert-R-aniline in excess isoamyl nitrite. These reaction components are heated to reflux at 80° C. for 2 hours. R may be Cl, Br, $NO_2$, or any suitable organofunctional group. Suitable organofunctional groups include, but are not limited to, tert-butyl and $CO_2CH_3$. The reaction scheme shown in FIG. 3 is based on the procedure disclosed by Dyke et al., "Solvent-Free Functionalization of Carbon Nanotubes," J. Am. Chem. Soc., 2003, Vol. 125, No. 5, pp 1156-1157, which is hereby incorporated herein by reference in its entirety. In accordance with some embodiments of the present invention, R is preferably a matrix-reactive group that includes at least one moiety (e.g., a vinyl-, allyl-, amine-, amide-, or epoxy-containing moiety) capable of reacting with and bind to the resin matrix. By judicious selection of the final reagent, the SWNTs can be functionalized to bind to the resin matrix.

Prophetic Example

Functionalization

In this prophetic example, f-SWNTs are prepared under solvent-free conditions. HiPco SWNTs (Unidym Inc., Sunnyvale, Calif., USA) are functionalized using 4-tert-butylaniline (2.5 equiv to SWNT carbon) in excess isoamyl nitrite. These reaction components are heated to reflux at 80° C. for 2 hours. After reaction, the reaction product is cooled to room temperature (r.t.), followed by purification using techniques well known in the art.

Blending

In this prophetic example, an epoxy resin formulation is used. One skilled in the art will appreciate, however, that any suitable resin may be used in lieu of, or in addition to, the particular epoxy resin formulation used in this prophetic example. The epoxy resin formulation used in the prophetic example includes: EPIKOTE Resin 828LVEL (available from Momentive Specialty Chemicals, Inc., Columbus, Ohio) (100 parts); dicyandiamide (5 parts); and 2-ethyl-4-methylimidazole (1 part). EPIKOTE Resin 828LVEL is a bisphenol-A type epoxy resin produced from bisphenol A and epichlorohydrin. Dicyandiamide and 2-ethyl-4-methylimidazole are commonly used curing agents.

Also, in this prophetic example, the total weight percent of SWNTs (f-SWNTs alone, non-functionalized SWNTs alone, or both) included in the resulting composite is kept constant at approximately 1 wt %. One skilled in the art will appreciate, however, that the total weight percent of SWNTs may be any suitable value (e.g., 0.1 wt % to 25 wt %). Preferably, the total weight percent of the SWNTs is selected to accommodate an anticipated range of permittivity attenuation/signal propagation delay (i.e., from a minimum anticipated permittivity attenuation/signal propagation delay to a maximum anticipated permittivity attenuation/signal propagation delay) that will be required of different permittivity attenuation layers. The total weight percent of SWNTs may be, for example, empirically determined based on such an anticipated range of permittivity attenuation/signal propagation delay. Working within the 1 wt % total weight percent of SWNTs of this prophetic example, the individual loading levels of the f-SWNTs (0 wt % to 1 wt %) and the non-functionalized SWNTs (1 wt % to 0 wt %) in the resin matrix of a permittivity attenuation layer may be empirically determined based on a particular amount of permittivity attenuation/signal propagation delay that is required of a particular permittivity attenuation layer.

Also, in this prophetic example, chloroform is used as a solvent in which to disperse the SWNTs. Chloroform is merely an exemplary solvent that is suitable for use with an epoxy resin. One skilled in the art will appreciate that any suitable solvent may be used in lieu of, or in addition to, chloroform. Solvents suitable for use with epoxy resins include, but are not limited to, chloroform, xylene, n-butanol, toluene, THF, and combinations thereof.

In this prophetic example, for each of several samples, 25 mg total carbon weight of SWNTs (f-SWNTs alone, non-functionalized SWNTs, or both) are dispersed into a minimal amount of chloroform by bath sonication. The loading level of the f-SWNTs relative to the loading level of the non-functionalized SWNTs in each sample is expressed as a ratio. For example, in a 1:0 sample of this prophetic example, some of the f-SWNTs (25 mg) prepared in the functionalization step are dispersed in the chloroform. In a 1:1 sample of this prophetic example, some of the f-SWNTs (12.5 mg) prepared in the functionalization step and HiPco SWNTs (Unidym Inc., Sunnyvale, Calif., USA) (12.5 mg) are dispersed in the chloroform. In a 0:1 sample of this prophetic example, HiPco SWNTs (Unidym Inc., Sunnyvale, Calif., USA) (25 mg) are dispersed in the chloroform. This chloroform mixture is then combined with EPIKOTE Resin 828LVEL (2.50 g). Then, the chloroform solvent is evaporated from the mixture with continuous stirring. This evaporation is readily accomplished (in a fume hood with efficient ventilation) by directing a stream of air over the continuously stirring mixture. The mixture is then heated to 60° C. for 2 hours in a vacuum oven to remove any remaining chloroform solvent. Then, dicyandiamide (125 mg) and 2-ethyl-4-methylimidazole (25 mg) are added as curing agents, and the resulting epoxy resin formulation with the SWNTs blended therein is thoroughly stirred.

Applying, Curing, etc. The epoxy resin formulation with the SWNTs blended therein is applied to a laminate core via screen coating to form a resin coating (i.e., step 110 of method 100 shown in FIG. 1, described above). The resin coating is initially cured for 1 hour at 100° C., and subsequently cured for 1 hour at 150° C. to form the permittivity attenuation layer (i.e., step 115 of method 100 shown in FIG. 1, described above). A copper trace is subsequently formed atop the permittivity attenuation layer using conventional copper foil laminating and etching techniques well known in the art (i.e., steps 120 and 125 of method 100 shown in FIG. 1, described above). The 1:0 sample produces the smallest amount of permittivity attenuation/signal propagation delay. The 1:1 sample produces an intermediate amount of permittivity attenuation/signal propagation delay. The 0:1 sample produces the largest amount permittivity attenuation/signal propagation delay. * * *End of Prophetic Example.* * *

Figure 4:
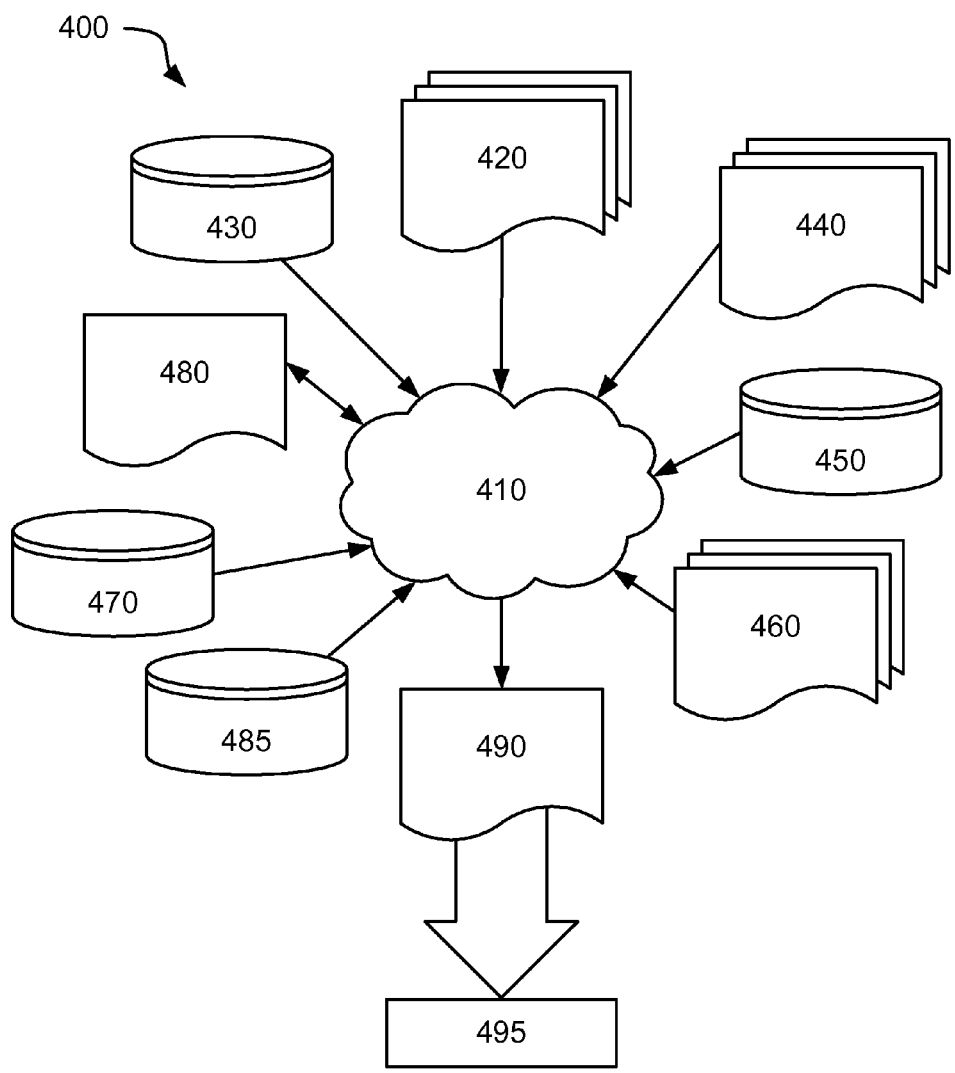
FIG. 4 is a flow diagram illustrating a design process used in printed wiring board (PWB), laminate subcomposite, interconnect substrate, flex cable, or semiconductor IC logic design, manufacture, and/or test in accordance with some embodiments of present invention.

FIG. 4 shows a block diagram of an exemplary design flow 400 used, for example, in printed wiring board (PWB), laminate subcomposite, interconnect substrate, or semiconductor IC logic design, simulation, test, layout, and manufacture. Design flow 400 includes processes, machines and/or mechanisms for processing design structures or devices to generate logically or otherwise functionally equivalent representations of the design structures and/or devices described above and shown in FIG. 1. The design structures processed and/or generated by design flow 400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in a printed wiring board, laminate subcomposite, interconnect substrate, or IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 400 may vary depending on the type of representation being designed. For example, a design flow 400 for building an application specific IC (ASIC) may differ from a design flow 400 for designing a standard component or from a design flow 400 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 420 that is preferably processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer. When encoded on a machine-readable data transmission, gate array, or storage medium, design structure 420 may be accessed and processed by one or more hardware and/or software modules within design process 410 to simulate or otherwise functionally represent an electronic component, circuit, electronic or logic module, apparatus, device, or system such as those shown in FIG. 1. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 preferably employs and incorporates hardware and/or software modules for synthesizing, translating, or otherwise processing a design/simulation functional equivalent of the components, circuits, apparatus, devices, or logic structures shown in FIG. 1 to generate a netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in a printed wiring board, laminate subcomposite, interconnect substrate, or integrated circuit design. Netlist 480 may be synthesized using an iterative process in which netlist 480 is resynthesized one or more times depending on design specifications and parameters for the device. As with other design structure types described herein, netlist 480 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 410 may include hardware and software modules for processing a variety of input data structure types including netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, and the like). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as laminating, casting, molding, die press forming, and the like. One of ordinary skill in the art of mechanical design can appreciate the extent of possible mechanical design tools and applications used in design process 410 without deviating from the scope and spirit of the invention. Design process 410 may also include modules for performing standard circuit design processes such as timing analysis, verification, design rule checking, place and route operations, and the like.

Design process 410 employs and incorporates logic and physical design tools such as HDL compilers and simulation model build tools to process design structure 420 together with some or all of the depicted supporting data structures along with any additional mechanical design or data (if applicable), to generate a second design structure 490. Design structure 490 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 490 may comprise a compiled, executable HDL simulation model that functionally simulates the devices shown in FIG. 1.

Design structure 490 may also employ a data format used for the exchange of layout data of integrated circuits and/or symbolic data format (e.g. information stored in a GDSII (GDS2), GL1, OASIS, map files, or any other suitable format for storing such design data structures). Design structure 490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 490 may then proceed to a stage 495 where, for example, design structure 490: proceeds to tape-out, is released to manufacturing, is released to a mask house, is sent to another design house, is sent back to the customer, and the like.

One skilled in the art will appreciate that many variations are possible within the scope of the present invention. For example, although some embodiments of the present invention are described herein in the context of a printed wiring board (PWB), the present invention may be utilized in the context of other substrates, such as a laminate subcomposite, an interconnect substrate (e.g., an interposer or a module substrate), a flex cable, or an IC. Thus, while the present invention has been particularly shown and described with reference to some embodiments thereof, it will be understood by those skilled in the art that these and other changes in form and detail may be made therein without departing from the spirit and scope of the present invention.

What is claimed is:

1. An apparatus, comprising:
   a substrate;
   a first conductive trace, wherein the first conductive trace comprises an inner-leg conductive trace of a differential pair;
   a second conductive trace, wherein the second conductive trace comprises an outer-leg conductive trace of the differential pair;
   a permittivity attenuation layer interposed between the first conductive trace and the substrate, wherein the permittivity attenuation layer comprises a resin matrix containing functionalized carbon nanomaterial and non-functionalized carbon nanomaterial blended with the functionalized carbon nanomaterial, wherein the functionalized carbon nanomaterial comprises functionalized single-wall carbon nanotubes (f-SWNTs) functionalized to include either amine functional groups or alkoxy functional groups, wherein the non-functionalized carbon nanomaterial comprises non-functionalized single-wall carbon nanotubes (SWNTs), and wherein the loading level of the f-SWNTs and the loading level of the non-functionalized SWNTs are selected to attenuate the permittivity of the inner-leg conductive trace to match the permittivity of the outer-leg conductive trace.

2. The apparatus as recited in claim 1, wherein the substrate is a laminate core for use in a printed wiring board (PWB), wherein the laminate core comprises a glass fiber substrate impregnated with a varnish coating, and wherein the resin matrix of the permittivity attenuation layer and the varnish coating of the laminate core each includes an epoxy-based resin.

* * * * *